US006317256B1

(12) United States Patent
Kunkee et al.

(10) Patent No.: US 6,317,256 B1
(45) Date of Patent: Nov. 13, 2001

(54) METHOD OF GAIN AND NOISE FIGURE EQUALIZATION FOR SIMULTANEOUS OPTICAL SPLITTER/AMPLIFIER

(75) Inventors: Elizabeth T. Kunkee, Manhattan Beach; James E. Leight, Los Angeles, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/504,540

(22) Filed: Feb. 15, 2000

(51) Int. Cl.$^7$ ...................................................... H01S 3/00
(52) U.S. Cl. .......................................... 359/344; 359/337.1
(58) Field of Search .................................. 359/344, 349, 359/495, 337

(56) References Cited

U.S. PATENT DOCUMENTS

| 4,194,162 | * | 3/1980 | Uematsu et al. ....................... 330/4.3 |
| 4,747,650 | * | 5/1988 | Sakuda ............................... 350/96.14 |
| 4,794,346 | * | 12/1988 | Miller ................................... 330/4.3 |
| 5,239,410 | * | 8/1993 | Nishimura et al. ..................... 359/344 |
| 5,864,574 | * | 1/1999 | Welch et al. ............................ 372/50 |
| 6,047,096 | * | 4/2000 | Augustsson ............................ 385/37 |
| 6,205,163 | * | 3/2001 | Hamamoto ............................. 372/43 |

FOREIGN PATENT DOCUMENTS

| 2768524-A1 | * | 3/1999 | (FR) ................................. G02B/6/12 |
| 6348534 | | 8/1986 | (JP). |
| 3156407 | | 11/1989 | (JP). |
| 6222408 | | 12/1993 | (JP). |

OTHER PUBLICATIONS

J. M. Heaton, et al., "Novel 1–to–N Way Integrated Optical Beam Splitters Using Symmetric Mode Mixing in GaAs/AlGaAs Multimode Waveguides", Applied Physics Letters, pp. 1754–1756, vol. 61, No. 15, Oct. 12, 1992.

Patent Application Laid–Open No. 63–48534, Yoshino et al., 'Optical Splitter–and–Combiner', Application Date Aug. 19, 1986.*

Patent Application Laid–Open No. 3–156407, Arii et al., 'Optical Splitter', Application Date Nov. 15, 1989.*

Patent Application Laid–Open No. 6–222408, Baori et al., 'Optical Switching Array of Semiconductor Structure Diode', Application Date Dec. 9, 1993.*

Heaton et al., 'Novel 1–to–N way integrated optical beam splitters using symmetric mode mixing in GaAs/AlGaAs multimode waveguides', Applied Physics Letters, Oct. 12, 1992, pp. 1754–1756.*

Soldano et al., 'Optical Multi–Mode Interference Devices Based on Self–Imaging: Principles and Applications', Journal of Lightwave Technology, Apr. 1995, pp. 615–627.*

Leuthold et al., 'Wide Optical Bandwidths and High Design Tolerance of Multimode–Interference Converter–Combiners', ECIO '97, Stockholm, Apr. 2–4, 1997, pp. 154–157.*

(List continued on next page.)

Primary Examiner—Thomas H. Tarcza
Assistant Examiner—Deandra Hughes

(57) ABSTRACT

A method (100) and process (120) for extending the optical bandwidth of an optical signal splitter/amplifier (160) that includes optical amplifier material and an multi-mode interference splitter. A wider bandwidth is obtained by equalizing both the gain and noise figures for the splitter/amplifier (160) as a function of the perfect focus wavelength of the splitter and the amplified spontaneous emission spectra of the gain material. The peak wavelength of the semiconductor optical amplifier material is offset a distance from the perfect focus wavelength so that the net gain of the splitter/amplifier (160) is the semiconductor gain multiplied by the insertion loss of the splitter.

8 Claims, 3 Drawing Sheets

OTHER PUBLICATIONS

Kudo et al., 'Densely Arrayed Eith–Wavelength Semiconductor Lasers Fabricated by Microarray Selective Epitaxy', IEEE Journal of Selected Topics in Quantum Electronics, May/Jun. 1999, pp. 428–434.*

Dagens et al., 'Multiwaveguide SOA for Increase Saturation Power without Noise Penalty', Electronics Letters, Mar. 18, 1999, pp. 485–486.*

Sasaki et al., '10 Wavelength MQW–DBR Lasers Fabricated by Selective MOVPE Growth', Electronics Letters, May 12, 1994, pp. 785–786.*

Zah et al., 'Monolithic Integration of Multiwavelength Compressive–Strained Multiquantum–Well Distributed–Feedback Laser Array with Star Coupler and Optical Amplifiers', Electronics Letters, Dec. 3, 1992, pp. 231–2362.*

Young et al., 'Six Wavelength Laser Array with Integrated Amplifier and Modulator', Electronics Letters, Oct. 12th, 1995, pp. 1835–1836.*

* cited by examiner

METHOD OF GAIN AND NOISE FIGURE EQUALIZATION FOR SIMULTANEOUS OPTICAL SPLITTER/AMPLIFIER

RELATED APPLICATION

This application is related to patent application entitled "Active Multi-Mode Optical Signal Splitter" by Zmudzinski bearing Attorney Docket #11-0837/60361 filed May 30, 1997, the entirety of which is incorporated herein by reference.

TECHNICAL FIELD

The present invention relates in general to optical signal splitting using a simultaneous optical splitter/amplifier (SOSA) and more particularly, to a SOSA whose gain and noise figure performance is equalized to obtain nearly uniform performance over a wider bandwidth compared to conventional splitter/amplifier devices. More particularly, the present invention provides a process for fabricating a SOSA having equalized gain and noise figures to extend the useful bandwidth of the device.

BACKGROUND OF THE INVENTION

There is a significant interest in the development of photonically implemented antennas for military and commercial communication and RADAR applications. Several candidate architectures under investigation are active phased arrays, direct radiating multiple beam antennas (MBA), and array-fed-reflector MBAs. Most demonstrations and experimental investigations to date have been constructed with relatively few elements and passive optical systems to and from the array elements. In the future, practical antenna systems achieving useful levels of performance will require active distribution of optical power to as many as hundreds or thousands of individual array elements.

Active optical distribution components, realized using the self-imaging properties of multi-mode interference (MMI) cavities, represent an integrated enabling technology for these types of systems. An active MMI based optical splitter also represents a potentially compact and reliable, electrically pumped unit for active distribution nodes in increasingly more prolific ground based digital or analog, single or multiple wavelength fiber-optic networks.

An example of such a splitting device is described in the related application by Zmudzinski. The related application discloses and claims an active multimode optical signal splitter with an optical multimode waveguide which allows for signal splitting and current pumping in order to provide optical power amplification and minimize losses due to signal splitting. The type of device described in the related application falls into the broader class of optical signal components known as the simultaneous optical splitter/amplifier or SOSA.

The SOSA has been established as a useful and potentially critical component in several optical systems such as phased array radar and optical signal processing. In essence, the SOSA is a MMI splitter, which has the added feature of optical gain. As the optical signal is split (attenuating the signal), the pumped semiconductor material provides gain to the light (amplifying the signal). The output of the SOSA consists of multiple outputs, each of which can have the same intensity as the original inputs.

While the SOSA may prove to be an integral component of optical signal distribution systems, it would be more useful if it could operate over an extended wavelength range or optical bandwidth, enabling its use in wavelength division multiplexing (WDM) systems. In conventional SOSAs, the optical bandwidth is a function of the splitter wavelength response and amplifier optical gain response, which are aligned in order to maximize performance for a single wavelength. This conventional configuration of a SOSA, however, limits their application to multi-wavelength signal distribution systems.

As such, an optical signal splitter/amplifier whose bandwidth is greater than the bandwidth of the individual splitter and gain components would provide numerous advantages.

SUMMARY OF THE INVENTION

The present invention provides a method and process of making an MMI splitter combined with optical gain material having equalized gain and noise figures that provides an optical splitter/amplifier with a wider optical bandwidth. The method of the present invention can be utilized to fabricate splitter/amplifier devices suitable for use in multiple wavelength optical signal distribution systems such as those employing wavelength division multiplexing.

In particular, the method of the present invention can be used for extending the useful bandwidth of a SOSA by equalizing gain and noise figure performance over an optical bandwidth spanning tens of nanometers. This equalization technique relies on a subtle yet important alteration of the physical configuration of the SOSA in order to obtain nearly uniform device performance over a wider optical bandwidth.

As such, disclosed is a method of designing the semiconductor optical amplifier material and the MMI splitter in order to achieve gain and noise figure equalization. The method includes the step of equalizing the device by designing the wavelength of peak optical gain for the semiconductor material to be different (typically by about 15 nm) from the wavelength for perfectly focused spots produced by the MMI splitter. In effect, the net gain, as measured by the light coupled to the output of the device, is the semiconductor gain multiplied by the insertion loss of MMI splitter.

Equalization is achieved such that when the gain of the optical semiconductor material is at a peak, the MMI splitter is slightly defocused. Likewise, when the MMI splitter is perfectly focused, the semiconductor gain is reduced from its peak value. In this manner, the net gain of the device is flattened over a wide range of wavelengths. The method also includes the step of equalizing the noise figure of the SOSA so that the noise figure and gain figure are equalized at the same time.

Also disclosed is a process for fabricating a simultaneous optical splitter/amplifier comprising the steps of epitaxially growing a substrate layer to a predetermined thickness associated with a desired peak wavelength response and lithographically patterning a set of optical waveguides on the substrate layer to form a multi-mode interference splitter with a desired perfect focus wavelength. Next, the necessary electrical contacts are formed and aligned with the multi-mode interference splitter. The geometry and quantum well structure of the substrate layer is controlled to cause the desired peak wavelength amplification response to be offset from the desired perfect focus wavelength.

Further disclosed is a simultaneous optical splitter/amplifier comprising a semiconductor optical amplifier material formed on a substrate layer and a multi-mode interference splitter formed in the substrate layer and epitaxial layers with electrical contacts attached to the substrate and epitaxial layers and aligned to direct signals into and out of the splitter. The semiconductor optical material is such that its peak wavelength is offset from the perfect focus wavelength of the multi-mode interference splitter. In one embodiment, the semiconductor optical material's peak wavelength is offset approximately 15 nanometers from the perfect focus wavelength of the multi-mode interference splitter to give the simultaneous optical splitter/amplifier a bandwidth of approximately 55 nm.

A technical advantage of the invention is that wavelength equalization is achieved without compromising the optical amplification in the SOSA which is necessary to achieve 0 dB optical signal splitting, so that the output optical signals have the same intensity as the input optical signals.

Another technical advantage of the invention is the achievement of an optical splitter/amplifier useful in wavelength division multiplexed (WDM) systems. The performance of the equalized SOSA is superior to conventional SOSAs which, in turn, is superior to splitting followed by post-amplification.

BRIEF DESCRIPTION OF THE DRAWINGS

Other advantages of the invention including specific embodiments will be understood by those of ordinary skill upon reference to the following detailed description taken in conjunction with the appended drawings in which.

Figure 1:
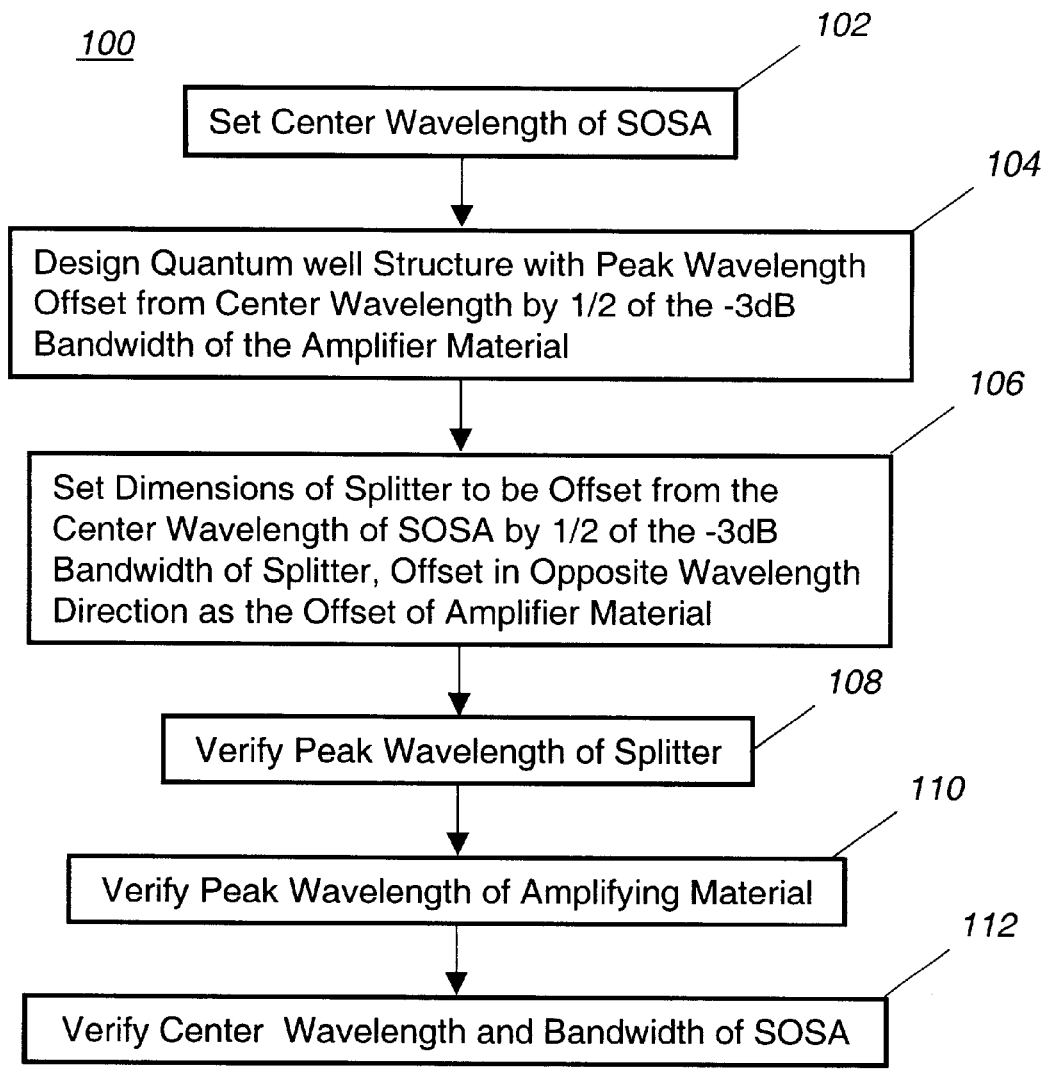
FIG. 1 is flow diagram illustrating the method of equalization of the present invention according to one embodiment.

References in the figures correspond to like references in the detailed description unless otherwise indicated.

DETAILED DESCRIPTION OF THE PREFERRED EMBODIMENTS

The present invention is a method and process for extending the useful bandwidth of a simultaneous optical signal splitter/amplifier (SOSA) comprised of a semiconductor optical amplifier material and a multi-mode interference (MMI) splitter. A wider bandwidth is obtained by equalizing both the gain and noise figures for the splitter/amplifier as a function of the perfect focus wavelength and the amplified spontaneous emission peak. The peak wavelength of the semiconductor optical amplifier material is offset a distance from the perfect focus wavelength so that the net gain of the splitter/amplifier is the semiconductor gain multiplied by the insertion loss of the device.

Previous work has demonstrated the superiority of a SOSA with respect to gain. The SOSA provides for higher gain saturation powers, and better noise figure performance, and is superior to post-amplification of optical signals after splitting, for systems which require both splitting and amplification of a signal. The related application by Zmudzinski discloses and claims such devices and a process for fabricating such a device. Another reference is entitled "Microwave optical splitter amplifier integrated chip (MOSAIC) using semiconductor optical amplifiers," by C. Zmudzinski, E. Twyford, L. Lembo, R. Johnson, F. Alvarez, D. Nichols, and J. Brock Essentially. Proc. SPIE, vol. 2844, pp. 163–174 (1996). The invention builds and improves on the work of Zmudzinski by disclosing a technique of altering the physical characteristics of a SOSA using well known fabrication methods and processes to affect the physical and qualitative properties of a SOSA and extend its useful bandwidth according to the method(s) of the invention. As such, those of ordinary skill in the art will appreciate the aspects of the invention and their application to the development of splitter/amplifier devices as herein described.

In general, SOSA performance requirements for photonically implemented antenna arrays are low insertion loss (<2 dB), moderate optical noise figure (between 3 dB (quantum limit) and 6 dB), and output saturation optical powers of several mW. When SOSAs are inserted into wavelength division multiplexed (WDM) systems, there is an additional requirement that these characteristics be demonstrated over wavelengths spanning a few tens of nanometers. MMI optical splitter/amplifiers have been shown to be an attractive alternative to Y-branch splitter/amplifiers for application to photonically implemented phased array antenna systems.

In general, an MMI splitter will create a fixed number of uniformly spaced spots of light which are images of the input light spot. The spots of light typically number between 1 and 16 although the actual number depends on the length of the MMI splitter. In between the correct splitter length for a particular number of spots the spots become defocused, and then diffuse, before reforming into another set of spots whose number is one more or one less. The length of the device denotes both a physical length (microns) and a relative length (number of wavelengths) with respect to the input light. Thus, if the wavelength of the Input light is changed slightly, the MMI splitter no longer forms perfect images of the input spot, but instead forms defocused images. In other words, an MMI splitter of the SOSA, having a certain length, will generate substantially perfectly focused images or spots for an optical input signal of a certain wavelength. This wavelength for a splitter of a given length shall be referred to, for purposes of this invention, as the perfect focus wavelength. At wavelengths different than the perfect focus wavelength, the output image becomes defocused for that length splitter. For this reason, the usefulness of the MMI splitter as a component In WDM systems is compromised.

As such, the bandwidth of the MMI splitter has been recognized as a fundamental limitation, and the inventors are unaware of any solutions proposed to date. When the perfect focus wavelength changes, the output spots defocus, decreasing the amount of light coupled into the output fiber and thus decreasing the gain. Similarly, the noise figure is compromised at any wavelength other than the design wavelength. A SOSA with equalized noise and gain figure performance would be useful over a wider bandwidth and for a larger number of applications, such as phonically controlled antennas and radar systems.

Accordingly, the inventors herein disclose and claim a method for modifying the physical structure and qualities of the SOSA to equalize the gain and noise figures of the device. With reference to FIG. 1, therein Is shown a flow diagram of the process, denoted generally as 100, of the invention according to one embodiment. Process 100 begins by setting the center wavelength of the SOSA (step 102) and then properly designing the quantum well structure (step 104) of the device to set the center peak wavelength of the peak response for the amplifying material, as desired Essentially, the well material and barrier material of the optical semiconductor are designed to give a specific band gap energy.

Next, process 100 is directed to the step of properly designing the geometry or dimensions of the splitter within acceptable tolerances (step 106) to a specified length and width. The bandwidth of the device can be tested to verify where the center wavelength of the material lies. This involves verifying the peak wavelength of the device (step 108) as well as the peak wavelength of the amplifier material (step 110). Finally, the center wavelength of the device is verified as well as its bandwidth (step 112).

Figure 2:
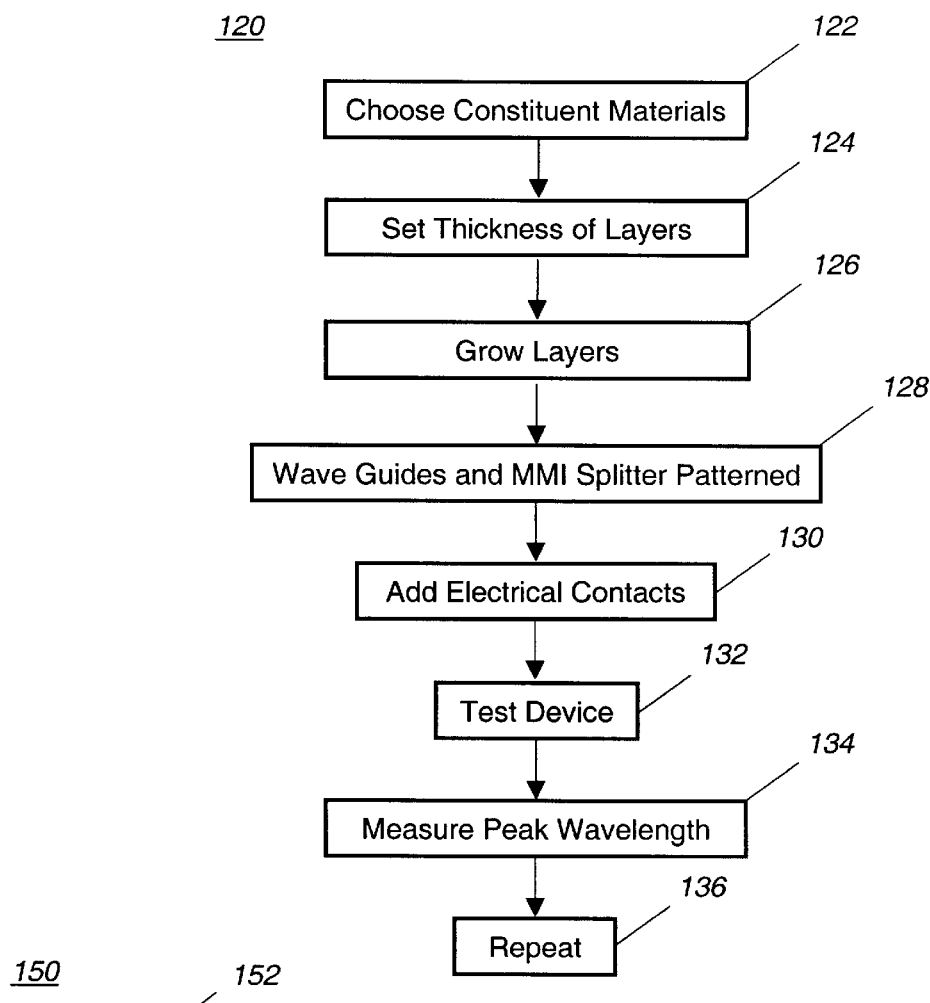
FIG. 2 is a flow diagram illustrating the process for fabricating an equalized SOSA with wider bandwidth according to one embodiment of the invention.

FIG. 2 is a flow diagram illustrating a related process 120 for fabricating a SOSA whose gain response is centered at a desired wavelength according to the invention. First, the constituent material of the barriers and wells is chosen (step 122) for the substrate. Next, the thicknesses of the substrate layers is set (step 124) and the layers are epitaxially grown (step 126) to the desired thickness. In this way, the peak response of the semiconductor material is controlled for a particular wavelength. Finally, the optical waveguides are lithographically patterned (step 128) into the selected material and all the additional processing necessary to add electrodes and other electrical contact terminals is performed (step 130).

As can be appreciated by those of ordinary skill, a number of variables may be considered in growing the layers (step 126) including the desired device length and width, the material layer structure which makes up the device, and the depth to which the device is etched into the semiconductor. Process 120 can be modified or altered according to well known methods of growing and etching semiconductor material as well as principles of material science and semiconductor physics. The device can be tested (step 132) to determine where the peak wavelength or peak response lies (step 134). If the desired gain response is not achieved at the center wavelength, then the process 100 can be iterated (step 136) until the desired gain response at the center wavelength is realized. Thus, by designing the physics and geometry of the device, the gain figure of the optical semiconductor material used in fabricating the SOSA can be determined.

The noise figure of the SOSA is similarly equalized. Essentially, the noise figure is a measure of the ratio of amplified spontaneous emission (ASE) to the gain of the SOSA. Therefore, if the gain is equalized, the noise figure is also equalized.

Figure 3:
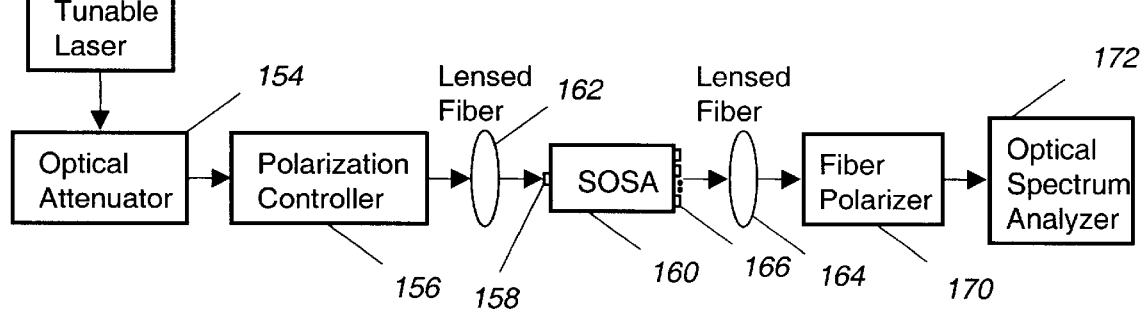
FIG. 3 illustrates an experimental setup for use in verifying the gain and noise figure equalization method of the present invention.

The process 120 can be applied to fabricate a SOSA with a four-quantum well InGaAlAs based quaternary structure for the active layer, that is 62 μm wide and is cleaved to an approximate length of 1050 μm. This configuration supports an expected 1×10 optical split. Having described the process 100 for fabricating a SOSA with a desired gain response, a method of testing a SOSA to determine its useful bandwidth can be utilized. Accordingly, a diagram of an experimental setup, denoted generally as 150, suitable for testing and verifying a SOSA's gain response is shown in FIG. 3.

As shown, an external cavity tunable laser 152 provides a single-mode fiber coupled light source. In one embodiment, the light source covers a wavelength range between 1290 nm to 1360 nm. The output of the tunable laser 152 can be passed through an electronically controllable optical attenuator 154 and a fiber-optic polarization controller 156 before being coupled into the input 158 of the SOSA 160. A lensed single mode fiber 162 can be used for this purpose and, in one embodiment, the lensed fiber 162 is centered on the cavity of the SOSA 160 and adjusted by rotation to a perpendicular orientation.

In one testing scenario, the SOSA 160 is fabricated without input or output coupling waveguides and with anti-reflection coating applied prior to being bonded junction-side down onto a C-type optoelectronic mount. The device can be tested with a nominal biasing current of 300 mA of current and thermoelectrically controlled to a temperature of 20 EC. A microscope objective and charge coupled device camera sensitive to infrared light can be used to visually optimize the input coupling for uniform imaging after which a second lensed fiber 164 is used to fiber couple the output 166 of a single imaged spot. The use of the second lensed fiber 164 permits coupling of an individual imaged spot as well as rejection of any input light propagating through the device substrate.

A fiber polarizer 170 can be used to verify that the output light is linearly polarized as well as to reject the amplified spontaneous emission (ASE) noise in the polarization orthogonal to the output light signal. The optical Noise Figure (NF) of the SOSA 160 can then be determined by measuring the optical power and wavelength of the light source at the input 158 as well as the output optical Signal-to-Noise Ratio (SNR) at the output 166. The NF is then governed by Equation 1 below which is valid for large amplifier gain.

$$NF_{int} = \frac{2P_{in}}{(SNR-1)L_{in}hv\Delta v} \quad \text{Equ. 1}$$

Where $NF_{int}$ is the internal noise figure of the amplifier (linear units), $P_{in}$ is the input optical power (W), $L_{in}$ is the input coupling loss (linear units), SNR is the optical signal-to-noise ratio at the output given by $P_{out}/P_{ase}$ (linear units), h is Plank's constant (J/K), Λ is the frequency (Hz) of the optical input 158, and) Λ is the resolution bandwidth (Hz) of the optical spectrum analyzer 172. The external noise figure of the device can be determined by omitting consideration of the input coupling loss and represents a figure of merit derived from fully measurable parameters. Determination of the $NF_{int}$ requires deduction of the input coupling loss, which introduces error to the calculation and requires additional measurement of the SOSA 160. However, due to the potential for reduction of the coupling losses to nearly 2 dB, the $NF_{int}$ is of most interest as it represents the potential utility of the SOSA 160.

The experimental setup 150 can also be used to determine the input and output insertion loss. The first input lensed fiber 162 can be connected to an optical power meter and adjusted to maximize coupling of the SOSA's ASE noise power. The ASE noise power coupled into the second lensed fiber 164 from the input 158 can then be measured. This same procedure can be performed to measure the maximum ASE noise power from the output 166. Next, light at 1550 nm, for which the SOSA gain medium is nearly transparent, can be coupled into the input 158 and the first lensed fiber 162 adjusted to maximize the contrast in the output spots to determine the insertion loss of the SOSA 160.

Figure 4:
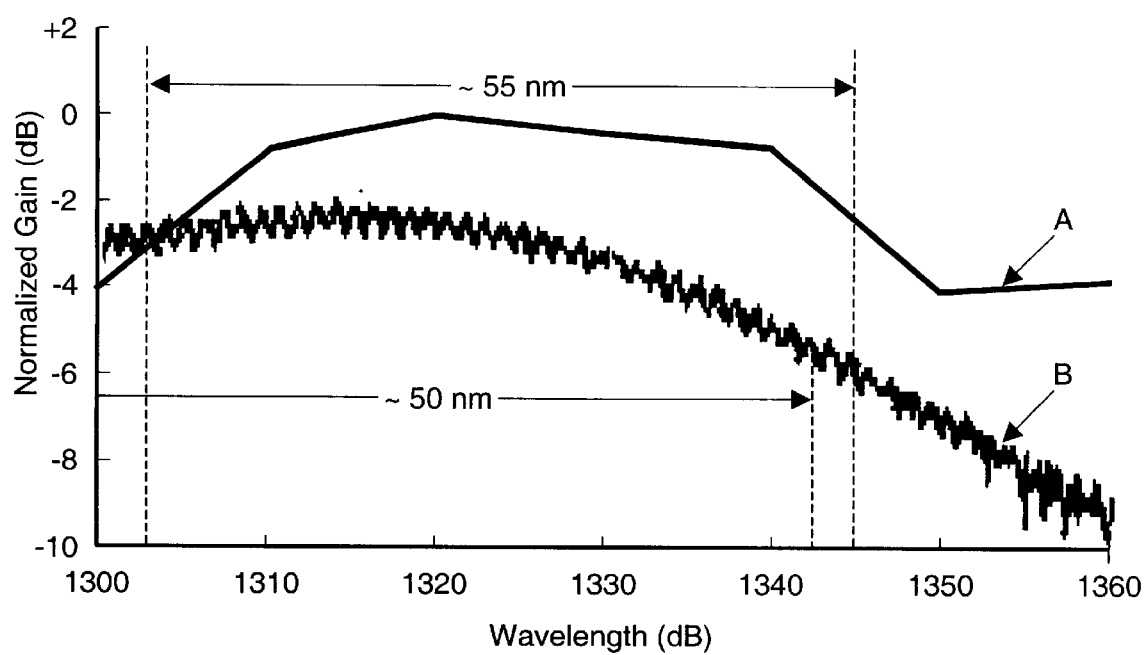
FIG. 4 is a plot illustrating the wider bandwidth of an equalized SOSA realized through use of the noise and gain figure equalization method of the present invention.

The SOSA gain can then be measured and plotted as a function of wavelength as illustrated in FIG. 4. As indicated by the line "A", the SOSA 160 demonstrates a −3 dB optical gain bandwidth of nearly 55 nm. The optical amplifier ASE noise spectrum of one of the output spots is also indicated by the line "B" which represents the −3 dB optical gain bandwidth of the gain medium. This bandwidth is approximately 50 nm. It is clear from examination of FIG. 4 that the SOSA 160 gain extends to wavelengths beyond the bandwidth of the optical amplifier alone. In addition, the total optical bandwidth of the SOSA is wider than would be expected due to the combined wavelength response of an optical amplifier and MMI splitter whose center wavelengths were aligned.

Accordingly, an optical splitter/amplifier suitable for WDM applications is obtained when the wavelength of optimum splitting is offset from the peak wavelength of the amplifier by several tens of nanometers. The process 100 provides a SOSA 160 with an extended optical bandwidth beyond the bandwidth which would be realized from perfect alignment of the splitter and amplifier optical gain responses. In one embodiment, the SOSA 160 is optimized for single wavelength systems by cleaving the device to the correct length so that the splitter response and amplifier gain response match. The SOSA 160 can be optimized for multiple wavelength systems by adequately offsetting the splitter and amplifier gain responses to equalize the response of the SOSA 160 over each optical wavelength.

The SOSA 160 demonstrates adequate gain performance over 60 nm and noise figure equalization over at least 40 nm. Noise figure results around 6 dB making the SOSA 160 suitable for use in a variety of single and multiple wavelength optical distribution applications.

While the SOSA 160 exhibits less peak gain, the semiconductor material can provide more than enough gain for operation of the SOSA 160 when the peak semiconductor optical gain and the optimal focusing wavelength are aligned. Thus, by decreasing the peak device gain, only excess gain is given up. The excess of available gain is illustrated by measured SOSA results which show that a SOSA which splits one signal into ten outputs has a net gain of 13 dB which is 3 dB more than is necessary to overcome the 10 dB splitting loss. Semiconductor optical amplifiers of comparable lengths have been fabricated by others with much higher gains than 13 dB. This shows that it is not a compromise to give up some gain in order to achieve gain and noise figure equalization.

While this invention has been described with reference to illustrative embodiments, this description is not intended to be construed in a limiting sense. Various modifications in combinations of the illustrative embodiments, as well as other embodiments of the invention, will be apparent to persons skilled in the art upon reference to this description.

What is claimed is:

1. For an optical splitter/amplifier including a semiconductor optical amplifier material and a multi-mode interference splitter, a method of equalizing the performance of the optical splitter/amplifier over a wider optical bandwidth as compared with the bandwidth of either the optical gain or the multi-mode interference splitter alone, the method comprising the steps of:

equalizing the gain of the splitter/amplifier as a function of the perfect focus wavelength of the multi-mode interference splitter, and equalizing the noise figure of the splitter/amplifier as a function of the amplified spontaneous emission and the gain of the splitter/amplifier.

2. The method according to claim 1 wherein said step of equalizing the gain is performed with the further steps of:

determining the perfect focus wavelength of the multi-mode interference splitter; and offsetting the peak wavelength of the semiconductor optical amplifier material to be a distance from the perfect focus wavelength of the multi-mode interference splitter.

3. The method of claim 2 wherein said offsetting step is performed by making the −3 dB point of the gain spectra of the amplifier material coincide with the −3 dB point of the output intensity spectra of the splitter/amplifier.

4. The method of claim 1 further comprising the step of testing to verify that the bandwidth of the splitter/amplifier is greater than that of either the semiconductor optical amplifier material or multi-mode interference splitter.

5. A simultaneous optical splitter/amplifier comprising:

a semiconductor optical amplifier material formed onto a substrate layer;

a multi-mode interference splitter formed on an epitaxial layer and said substrate layer; and electrical contacts aligned to direct signals into and out of said multi-mode interference splitter;

wherein said semiconductor optical material has the characteristic quality that its peak wavelength is offset from the perfect focus wavelength of said multi-mode interference splitter.

6. The simultaneous optical splitter/amplifier of claim 5 wherein said semiconductor optical material has the characteristic quality that the −3 dB point of the gain spectra of the amplifier material coincides with the −3 dB point of the output intensity spectra of the splitter/amplifier.

7. A process for fabricating a simultaneous optical splitter/amplifier comprising the steps of:

epitaxially growing a semiconductor layer to a predetermined thickness and composition associated with a desired peak wavelength response;

lithographically patterning and etching a set of optical waveguides on said layer to form a multi-mode interference splitter with a desired perfect focus wavelength; and forming electrical contacts aligned with said multi-mode interference splitter;

wherein the geometry and quantum well structure of said semiconductor layer is controlled to cause said desired peak wavelength response to be offset from said desired perfect focus wavelength.

8. The process according to claim 7 wherein said step of epitaxially growing a semiconductor layer is performed so that said desired peak wavelength response is offset from said desired perfect focus wavelength by approximately 15 nanometers.

* * * * *